United States Patent [19]

Hays, Jr.

[11] 4,160,963

[45] Jul. 10, 1979

[54] PLURAL SUPPLY PATH ACOUSTIC SURFACE WAVE DEVICE

[75] Inventor: Ronald M. Hays, Jr., Walnut Creek, Calif.

[73] Assignee: Texas Instruments Incorporated, Dallas, Tex.

[21] Appl. No.: 817,757

[22] Filed: Jul. 21, 1977

[51] Int. Cl.² .................. H03H 9/04; H03H 9/30; H03H 9/32; H01L 41/10
[52] U.S. Cl. ................ 333/151; 310/313; 333/154; 333/194; 333/195
[58] Field of Search .................... 333/30 R, 72, 71; 310/313; 331/107 A; 330/5.5

[56] References Cited

U.S. PATENT DOCUMENTS

| 3,984,791 | 10/1976 | Deacon | 333/30 R X |
| 4,023,124 | 5/1977 | Parker et al. | 333/30 R X |

FOREIGN PATENT DOCUMENTS

2346204  3/1975  Fed. Rep. of Germany ........... 310/313

OTHER PUBLICATIONS

Mason et al., "Physical Acoustics", vol. VII, 1970, Academic Press, New York and London; title page and pp. 226-233.
Brady et al., "Generation of High Frequency Acoustic Surface Waves on Piezoelectric Wafers" in IBM Tech. Disclosure Bulletin, vol. 15, No. 10, Mar. 1973, pp. 3273-3274.

Primary Examiner—Alfred E. Smith
Assistant Examiner—Marvin Nussbaum
Attorney, Agent, or Firm—Melvin Sharp; Richard L. Donaldson; William E. Hiller

[57] ABSTRACT

An acoustic surface wave device wherein an interdigital transducer is provided which includes interdigitated electrodes of narrow width and fine spacing extending from parallel bus bars. Means are provided electrically to interconnect members of a set of electrodes at a location spaced from the bus bar from which they extend to provide multiple current paths between the bus bar and metallization elements forming the electrodes. In one embodiment, apodized electrodes are interconnected adjacent ends of electrodes of the opposite set. In split electrode transducers, the electrodes of each pair are also interconnected at the ends opposite the associated bus bar.

3 Claims, 5 Drawing Figures

PLURAL SUPPLY PATH ACOUSTIC SURFACE WAVE DEVICE

This invention relates to acoustic surface wave devices, and more particularly to interdigitated electrode transducer structures employed as components thereof, wherein the transducer structures are provided with shorting means interconnecting adjacent electrodes of like potential remote from the bus bars.

In interdigitated structures such as used on surface wave transducers, flaws such as open lines or shorted lines cause device degradation and/or failure. Such flaws may be introduced in the photo plotting of the electrode patterns, or in creating images for patterning photo reduction, in contact printing of masks and associated devices, in projection printing, and in other processes required to fabricate devices through production of metallization, in photoresist, in crystal or material flatness and polish, in exposure, developing and cleaning and in the mechanics of handling. Problems in the foregoing areas, as well as in others, express themselves directly into losses in time, material and money, performance degradation and loss of repeatability. A technique which could render these flaws inconsequential significantly would improve yield and would be especially valuable in production environments.

The present invention is directed to improvements in acoustic surface wave devices by minimizing degradation due to open line flaws in interdigital transducers comprising components of the surface wave devices. In accordance with the invention, all lines of the same polarity are interconnected electrically at points remote from a common bus bar in a transducer structure.

More particularly, an interdigital transducer of a surface wave device is provided having sets of interdigitated electrodes wherein common bus bars are provided from which the sets extend. Means are then provided electrically interconnecting members of each like potential electrode set at locations spaced from the bus bar from which the set extends. Effectively short circuits are established. In apodized sets of electrodes, the shorting means preferably extends perpendicular to the electrodes at a plurality of locations spaced from the ends of the electrodes. In a further aspect, split electrodes are interconnected at the ends thereof opposite the associated bus bar.

The novel features believed characteristic of the invention are set forth in the appended claims. The invention itself, however, as well as further objects and advantages thereof, will best be understood by reference to the following detailed description of an illustrative embodiment taken in conjunction with the accompanying drawings, in which:

The invention will be described as applied to an apodized transducer of a surface wave device and to a split electrode transducer. Multiphase surface wave devices as well as continuations of any of the above may employ transducer structures in accordance with the invention.

Figure 1:
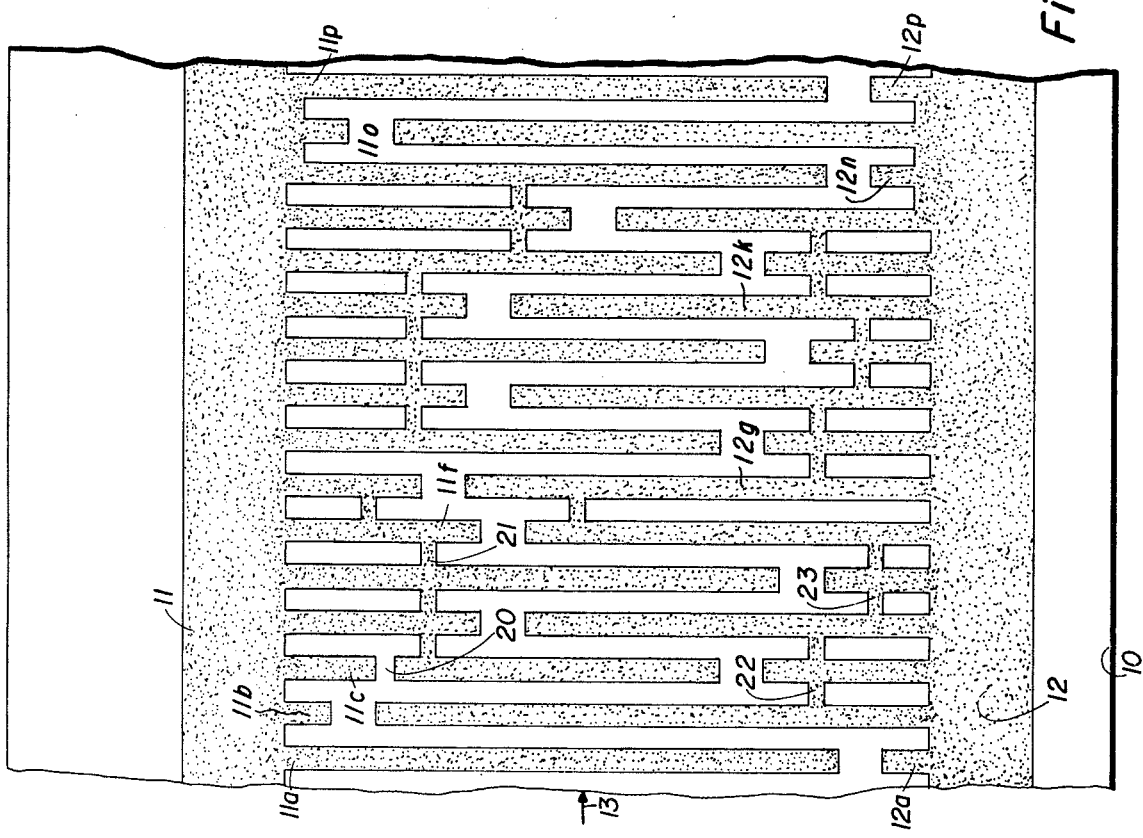
FIG. 1 illustrates an apodized interdigital transducer of a surface wave device embodying the present invention.

FIG. 1 illustrates a portion of a single phase interdigital transducer embodied in an acoustic surface wave device in which the present invention is applied. The surface wave device includes a substrate 10 having a surface of piezoelectric material on which the transducer is disposed. It will be understood that the substrate 10 may be made entirely of piezoelectric material, such as lithium niobate or quartz, or may be a composite structure including a body of some other material having a layer of piezoelectric material thereon to provide the piezoelectric surface. The transducer comprises upper and lower pads or bus bars 11 and 12 disposed in parallel relationship and extending lengthwise of the substrate 10. A first set of elongated electrodes $11a-11p$ extend from the upper pad or bus bar 11 transversely across the substrate 10 toward the lower pad or bus bar 12, the electrodes $11a-11p$ being of varying lengths and respectively terminating in spaced relation to the lower pad or bus bar 12. Similarly, a second set of elongated electrodes $12a-12p$ extend from the lower pad or bus bar 12 transversely across the substrate 10 toward the upper pad or bus bar 11, the electrodes $12a-12p$ also being of varying lengths and respectively terminating in spaced relation to the upper pad or bus bar 11. Thus, the electrodes are metallic strips which are interdigitated in varying degrees in the direction of the length of the bus bars 11 and 12. As is well known, variations in length, or apodizing of the sets of electrodes, provide selective weighting of the transducer and thus affect its interreaction with an acoustic wave which may be traveling along the surface of the substrate 10 in the direction of arrow 13. In the latter connection, it will be understood that an acoustic surface wave device typically includes input and output interdigital transducers, wherein an electrical input signal is applied to the input transducer. The input transducer converts the electrical signal to an acoustic signal principally in the form of an acoustic surface wave which travels along the piezoelectric surface of the substrate and is re-converted to an electrical signal by the output transducer.

In general, the surface wave devices are constructed to operate from a lower frequency of around 10 MHz to frequencies of up to and above 1 GHz (1,000 MHz). Typically, one of several known processes for forming the electrodes $11a-11p$ and $12a-12p$ involves evaporation of aluminum onto the surface of the substrate 10 followed by coating the same with a photoresist material and then exposing the same through a photomask to outline the electrodes $11a-11p$ and $12a-12p$ and the bus bars 11 and 12. This is followed by etching and then stripping the photoresist from the remaining portions. Typically, the metallization may be of the order of 1500 angstroms thick. The electrodes would be about 100 microinches wide and spaced 200 microinches on centers for operation in the range of about 300 MHz.

In such processes, it frequently is the case that an electrode such as electrode $11c$ has an open circuit or void 20 in the metallization forming the electrode $11c$. The present invention involves the installation of conductive segments or shorting bars such as bar 21 which electrically interconnects two or more of the electrodes of a common patterned set at points remote from the bus bar 11. As illustrated in FIG. 1, bar 21 interconnects electrodes 11c, 11d, 11e and 11f. Bar 21 is formed in the same metallization step as the electrodes themselves. Bar 21 preferably extends in a direction parallel to the length of the bus bar 11. The shorting bar 21 is located in offset relation to the respective ends of the electrodes 11c, 11d, 11e and 11f. In accordance with the present invention, a plurality of such shorting bars are employed to reduce the distance between the end of an electrode and a shorting element leading to a contiguous electrode. Thus, if there is a void, such as void 20 in electrode 11c, the electrode 11c if not rendered inoperative because of the void 20, since the interconnecting shorting bar 21 provides a separate current path via the electrode 11d from the bus bar 11 for the electrode 11c. In like manner, shorting bar 22 interconnects electrodes 12b, 12c and 12d, while shorting bar 23 interconnects electrodes 12d, 12e and 12f. Similarly, from an inspection of FIG. 1, it will be seen that multiple current paths are provided for other groups of electrodes by interconnecting shorting bars.

Certain stub electrodes 11b, 11o, 12a, 12n, and 12p comprise dummy electrodes which serve to avoid distortion of surface waves propagating in the direction of the arrow 13. In this respect, the velocity of surface wave propagation changes as between periods when the surface wave is travelling in the exposed substrate material and when travelling under a metal electrode disposed on the substrate. The middle portion of a surface wave generally encounters alternating exposed substrate material and metal electrodes in equal or periodic intervals. The edge portions of this same surface wave, in the absence of dummy electrodes, would tend to have different velocities as compared to the middle portion because of a greater lack of uniformity as between the alternating exposed substrate material and metal electrodes encountered thereby. The addition of the dummy electrodes 11b, 11o, 12a, 12n and 12p effectively causes the velocities of the edge portions of a surface wave to be equalized with the velocity of the middle portion. It will be understood that a shorting bar may be connected across a dummy electrode in which case, the dummy electrode so interconnected with other electrodes will provide an additional current path.

Figure 2:
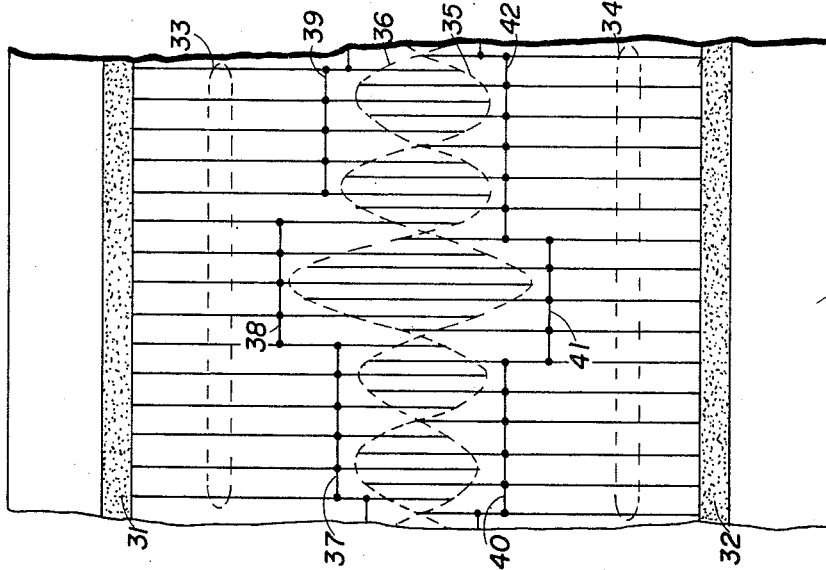
FIG. 2 illustrates a modification of the invention in which a severely apodized interdigital transducer is shown.

In FIG. 2, the piezoelectric surface of a substrate 30 is provided with a severely apodized transducer in which bus bars 31 and 32 are provided with electrodes 33 and 34, respectively, extending therefrom with the extremities of the electrodes defining patterns 35 and 36, respectively. In this arrangement, shorting elements or bars 37, 38 and 39 interconnect the electrodes of set 33. Shorting elements 40, 41 and 42 interconnect the elements of set 34. The shorting elements 37–42 extend parallel to bus bars 31 and 32 and are spaced from the terminating ends of the electrodes in the opposing set.

Figure 3:
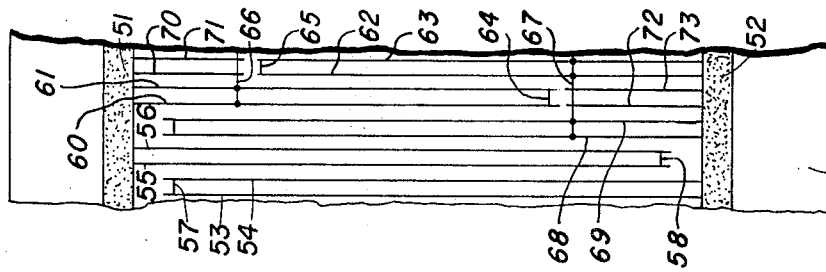
FIG. 3 illustrates an apodized interdigital transducer of a surface wave device in accordance with the present invention, wherein a split electrode construction is employed for the transducer.

FIG. 3 illustrates the application of the invention to interdigital transducers of the split electrode variety. More particularly, in FIG. 3, the piezoelectric surface of a substrate 50 is provided with bus bars 51 and 52. A split electrode configuration comprising a pair of electrodes 53 and 54 extends from the bus bar 52. Similarly, a split electrode configuration comprising a pair of electrodes 55 and 56 extends from the bus bar 51. A shorting bar 57 interconnects the electrodes 53 and 54 at a point remote from bus bar 52 but slightly offset with respect to the ends of the electrodes 53 and 54. In like manner, a shorting bar 58 interconnects the electrodes 55 and 56 at a point slightly offset from the electrode ends and remote from the bus bar 51. Each of the other pairs of electrodes are shorted at the ends opposite the bus bar from which they extend so that any open circuit condition along the length of any single electrode included in a split electrode pair is rendered insignificant by the provision of multiple current paths provided by the shorting bars.

Where there is a substantial distance from the ends of a split electrode pair to the opposing bus bar, i.e. a distance of 2λ wavelengths where λ is the wavelength of the propagating surface wave, a second shorting bar may be employed. To this end, the electrodes 60 and 61 forming a split electrode pair extend from the bus bar 51 and terminate in spaced relation to the opposing bus bar 52, there being a distance of 2λ wavelengths between the split electrode pair 60, 61 and the bus bar 52. Similarly, electrodes 62 and 63 forming a split electrode pair extend from the bus bar 52 and terminate a distance 2λ wavelengths from the opposing bus bar 51. A first shorting bar 64 interconnects the electrodes 60, 61 and a first shorting bar 65 interconnects the electrodes 62, 63 at points remote from the respective bus bars 51 and 52 from which the split electrode pairs 60, 61 and 62, 63 extend. These shorting bars 64 and 65 correspond to the shorting bars 57 and 58 for the split electrode pairs 53, 54 and 55, 56. Second shorting bars 66 and 67 are provided for the split electrode pairs 60, 61 and 62, 63, since these split electrode pairs terminate a substantial distance from the respective opposing bus bars 52 and 51. The shorting bar 66 interconnects the split electrode pair 60, 61 at an intermediate point relatively close to the bus bar 51 to at least one other split electrode pair (not shown) extending from the same bus bar 51. The shorting bar 67 interconnects the split electrode pair 62, 63 at an intermediate point relatively close to the bus bar 52 to at least one other split electrode pair 68, 69 extending from the same bus bar 52. The shorting bars 66 and 67 extend parallel to the bus bars 51 and 52. As shown in FIG. 3, dummy split electrode pairs 70, 71 and 72, 73 may be respectively provided to improve the uniformity of propagating surface waves. The dummy split electrode pair 70, 71 extends from the bus bar 51 and is interconnected with the shorting bar 66 to provide additional current paths for the split electrode pair 60, 61. In like manner, the dummy split electrode pair 72, 73 extends from the bus bar 52 and is interconnected with the shorting bar 67 to provide additional current paths for the split electrode pair 62, 63.

Thus, in accordance with the present invention, means are provided for improving the yield and performance of usable interdigital surface wave transducers. Flaws such as open lines and shorted lines may be introduced in various ways resulting in unsatisfactory surface wave transducers. The provision of alternate current paths in accordance with the present invention, wherein electrodes of the same polarity are connected together electrically compensates for such flaws. Thus, the likelihood of open circuits in an apodized transducer with or without split electrodes is reduced or eliminated. The interdigitated structure with distinct dummy electrodes is also contemplated for the maintenance of a uniform phase front across the full aperture wherein the shorting bars would be a small part of the acoustic apertures. Preferably the shorting bars are perpendicular to the electrodes themselves and are positioned at a distance from the opposite polarity electrodes to prevent the occurrence of undesirable interfering electric fields. It will be appreciated that the shorting bars may be provided to extend at an angle other than 90 degrees relative to the electrodes.

Figure 4:
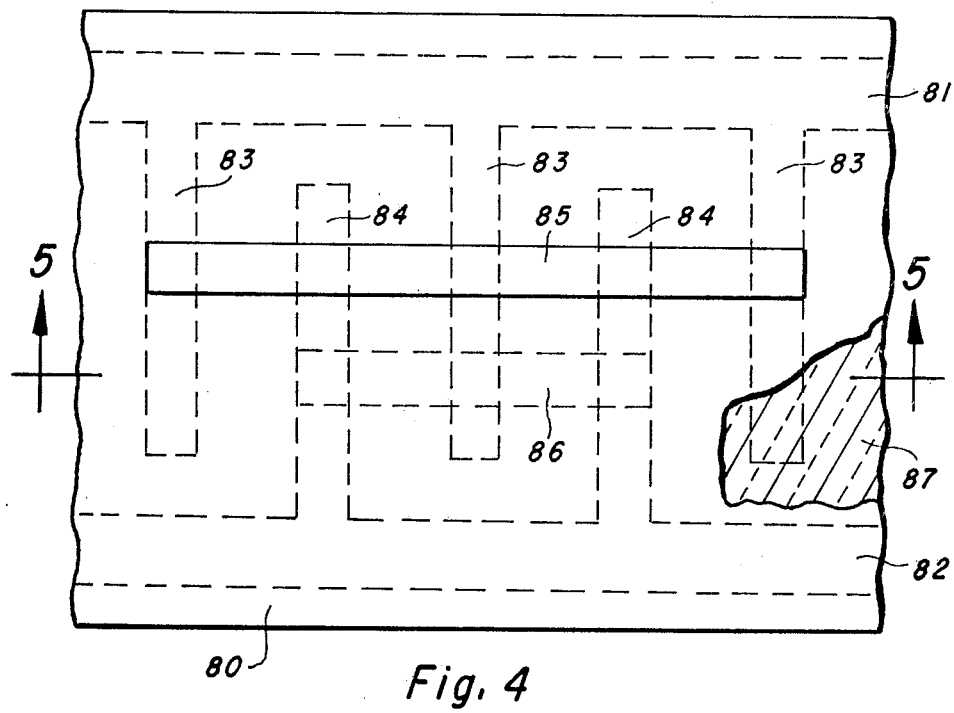
FIG. 4 is a plan view, partially broken away, illustrating a multiphase surface wave device in which the principles of the present invention are embodied.
Figure 5:
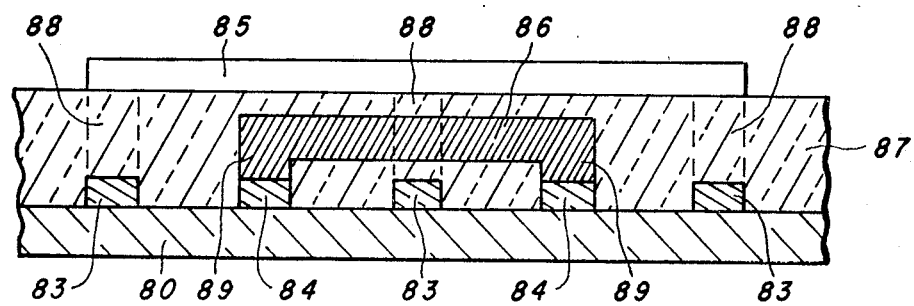
FIG. 5 is a longitudinal sectional view taken along the line 5—5 of FIG. 4.

Shorting bars may be provided in multiphase surface wave devices by employing an insulation layer over which and through which the shorting bars extend to electrically interconnect electrodes of like potential at points spaced from the common bus bar. To this end, attention is directed to FIGS. 4 and 5, where a two-phase surface wave device is illustrated which includes a substrate 80 of piezoelectric material or having at least a top surface of piezoelectric material. An interdigital transducer is disposed on the piezoelectric surface of the substrate 80, the transducer being of the two-phase type and including first and second sets of elongated metal electrodes extending from opposing bus bars or pads 81 and 82 into interdigitated relation to each other. The electrodes 83 of the first electrode set are excited by an electrical signal input (not shown), and the electrodes 84 of the second electrode set are excited by an electrical signal input (not shown) 180° out of phase with respect to the electrical signal input for the electrodes 83 of the first electrode set. Shorting bar 85 interconnects the electrodes 83 of the first electrode set, and shorting bar 86 interconnects the electrodes 84 of the second electrode set. The first set of electrodes 83 and the interconnecting shorting bar 85 are electrically isolated from the second set of electrodes 84 and the interconnecting shorting bar 86 by a layer of insulation material 87, such as silicon dioxide, disposed on the substrate 80 and covering the transducer. The shorting bar 85 is disposed over the insulation layer 87 and includes individual connector portions 88 extending through the thickness of the insulation layer 87 into engagement with the electrodes 83. The shorting bar 86 is embedded in the insulation layer 87 and includes individual stub connector portions 89 in engagement with the electrodes 84. The main body portion of the shorting bar 86 extends across one of the electrodes 83 of the first electrode set, being insulated therefrom by insulation material of the insulation layer 87. In the latter respect, the stub connector portions 89 of the shorting bar 86 serve as spacer members maintaining the body portion of the shorting bar 86 in spaced relation to the electrode 83 of the first electrode set. The presence of the shorting bars 85 and 86 provides alternate current paths for the respective electrodes interconnected thereby in the two-phase transducer structure of FIGS. 4 and 5 in the same manner as a single-phase transducer. It will be understood that three-phase transducer structures and other multiphase transducer structures may include shorting bar interconnect schemes of similar character.

Having described the invention in connection with certain specific embodiments thereof, it is to be understood that further modifications may now suggest themselves to those skilled in the art and it is intended to cover such modifications as fall within the scope of the appended claims.

What is claimed is:

1. In an acoustic surface wave device having a substrate provided with at least a surface of piezoelectric material, an interdigital transducer comprising:
    a plurality of bus bars disposed on the piezoelectric surface of said substrate in spaced substantially parallel relation with respect to each other and adapted to be excited by respective electrical signals of different phase,
    plural sets of elongated electrodes corresponding in number to said plurality of bus bars, each of said electrodes in a corresponding one of said electrode sets extending transversely from a respective bus bar toward another bus bar but terminating in spaced relation thereto,
    said plural electrode sets being arranged in interdigitated relation to define successive groups of individual electrodes from each of said plural electrode sets in a continuing series,
    shorting bars electrically interconnecting respective electrodes of the same electrode set at locations spaced from the bus bar from which the set extends to provide alternate current paths for the electrodes so interconnected,
    an insulation layer on the piezoelectric surface of said substrate and covering said plural electrode sets, and
    each of said shorting bars which electrically interconnect respective electrodes of one of said plural electrode sets being electrically isolated by said insulation layer from said shorting bars which electrically interconnect respective electrodes of another of said plural electrode sets.

2. The combination set forth in claim 1, wherein said plurality of bus bars comprise first and second bus bars and said plural electrode sets comprise first and second sets of electrodes respectively corresponding to said first and second bus bars.

3. In an acoustic surface wave device having a substrate provided with at least a surface of piezoelectric material, an interdigital transducer comprising:
    first and second bus bars disposed on the piezoelectric surface of said substrate in spaced substantially parallel relation with respect to each other,
    a first set of elongated electrodes extending transversely from said first bus bar toward said second bus bar but terminating short of said second bus bar,
    a second set of elongated electrodes extending transversely from said second bus bar toward said first bus bar but terminating short of said first bus bar,
    the electrodes respectively included in said first and second sets of electrodes being split electrode pairs disposed in an apodized configuration,
    said first and second sets of electrodes being arranged in interdigitated relation with respect to each other, and
    shorting bars electrically interconnecting respective electrodes of the same set at locations spaced from the bus bar from which the set extends to provide alternate current paths for the electrodes so interconnected, said shorting bars including first shorting bars electrically interconnecting the electrodes of each split electrode pair at their ends remote from the bus bar from which they extend and second shorting bars electrically interconnecting respective split electrode pairs of common potential at locations intermediate the ends of said split electrode pairs such that at least the electrodes of certain of said split electrode pairs are electrically interconnected at two locations by said first and second shorting bars.

* * * * *